(12) United States Patent
Furukawa et al.

(10) Patent No.: US 7,834,384 B2
(45) Date of Patent: Nov. 16, 2010

(54) SIMULTANEOUS CONDITIONING OF A PLURALITY OF MEMORY CELLS THROUGH SERIES RESISTORS

(75) Inventors: Toshijaru Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Chung H. Lam, Peekskill, NY (US); Gerhard I. Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 12/060,922

(22) Filed: Apr. 2, 2008

(65) Prior Publication Data
US 2008/0185652 A1 Aug. 7, 2008

Related U.S. Application Data (63) Continuation of application No. 11/400,596, filed on Apr. 7, 2006, now abandoned.

(51) Int. Cl.
*H01L 27/00* (2006.01)
(52) U.S. Cl. .................... 257/295; 438/3; 257/E27.104
(58) Field of Classification Search .............. 438/3; 257/295, E27.104
See application file for complete search history.

(56) References Cited

U.S. PATENT DOCUMENTS

| 6,204,139 | B1 | 3/2001 | Liu et al. |
| 6,815,744 | B1 | 11/2004 | Beck et al. |
| 7,256,415 | B2 | 8/2007 | Furukawa et al. |
| 7,362,604 | B2 | 8/2008 | Scheuerlein |
| 2004/0036109 | A1 | 2/2004 | Inoue et al. |
| 2005/0122768 | A1* | 6/2005 | Fukumoto .................. 365/158 |
| 2005/0151277 | A1 | 7/2005 | Kawazoe et al. |
| 2006/0002172 | A1 | 1/2006 | Venkataraman et al. |
| 2006/0187701 | A1 | 8/2006 | Liaw |

FOREIGN PATENT DOCUMENTS

WO  WO 00/49659  8/2000

OTHER PUBLICATIONS

Beck, et al., "Reproducible Switchign Effect in Thin Oxide Films for Memory Applications," Applied Physics Letters, vol. 77, No. 1, Jul. 3, 2000, pp. 139-141.

(Continued)

*Primary Examiner*—W. David Coleman
*Assistant Examiner*—Sun M Kim
(74) *Attorney, Agent, or Firm*—Gibb I.P. Law Firm, LLC (57) ABSTRACT

Disclosed are a semiconductor structure and a method that allow for simultaneous voltage/current conditioning of multiple memory elements in a nonvolatile memory device with multiple memory cells. The structure and method incorporate the use of a resistor connected in series with the memory elements to limit current passing through the memory elements. Specifically, the method and structure incorporate a blanket temporary series resistor on the wafer surface above the memory cells and/or permanent series resistors within the memory cells. During the conditioning process, these resistors protect the transition metal oxide in the individual memory elements from damage (i.e., burn-out), once it has been conditioned.

17 Claims, 9 Drawing Sheets

OTHER PUBLICATIONS

Watanabe, et al., "Current-Driven Insulator-Conductor Transition and Nonvolatile Memeory in Chromium-Doped SrTiO3 Single Crystals," Applied Physics Letters, vol. 78, No. 23, Jun. 4, 2001, pp. 3738-3740.

Rossel, et al., "Electrical Current Distribution Across a Metal-Insulator-Metal Structure During Bistable Switching," Journal of Applied Physics, vol. 90, No. 6, Sep. 15, 2001, pp. 2892-2898.

Furukawa et al., U.S. Appl. No. 11/400,596, YOR920050531US1, Notice of Allowance, May 29, 2009, 4 pages.

* cited by examiner

SIMULTANEOUS CONDITIONING OF A PLURALITY OF MEMORY CELLS THROUGH SERIES RESISTORS

CROSS-REFERENCE TO RELATED APPLICATIONS

This application is a Continuation of U.S. application Ser. No. 11/400,596 filed Apr. 7, 2006, the complete disclosure of which, in its entirety, is herein incorporated by reference.

BACKGROUND

1. Field of the Invention

The present invention relates generally to a non-volatile memory device and an associated fabrication method. Particularly, the invention relates to a non-volatile memory device that incorporates a series of memory cells having memory elements comprising a bi-stable layer with programmable electrical resistance sandwiched between two conductive layers. Additionally, the invention relates to a method for manufacturing the non-volatile memory device that incorporates a process for simultaneously conditioning the transition metal oxide layer of each memory cell in a series such that the transition metal oxide layers exhibit a bi-stable electrical resistance.

2. Description of the Related Art

Flash erasable programmable read only memory (FEPROM or flash memory) is used in semiconductor devices and provides for rapid block erase operations. Flash memory generally requires only the use of one transistor per memory cell versus the two transistors per memory cell required for conventional electrically erasable programmable read only memory (EEPROM). Thus, flash memory takes up less space on a semiconductor device and is less expensive to produce. However, the need to develop further space saving components and to remain cost efficient in the fabrication of semiconductor devices continues. To that end, the use of materials with programmable electrical resistance for semiconductor device applications has been studied. The electrical resistance of resistance-switching materials, including but not limited to transition metal oxide materials, can be changed significantly by external influences, including temperature, magnetic fields and electric fields. Electrical impulses applied to theses materials can "program" them, such that they exhibit a desired resistive property. Specifically, the following referenced articles, international application and U.S. Patent, all of which are hereby expressly incorporated by reference into the present invention for purposes including, but not limited to, indicating the background of the present invention and illustrating the state of the art, describe materials and classes of materials with programmable electrical resistance and simple electrical resistor devices made from these materials: "Reproducible switching effect in thin oxide films for memory applications" (A. Beck et al., *Applied Physics Letters*, Vol. 77, No. 1, Jul. 2000); "Current-driven insulator-conductor transition and non-volatile memory in chromium-doped $SrTiO_3$ single crystals" (Y. Watanabe et al., *Applied Physics Letters*, Vol. 78, No. 23, Jun. 2001); "Electrical current distribution across a metal-insulator-metal structure during bi-stable switching" (C. Rossel et al., *Journal of Applied Physics*, Vol. 90, No. 6, Sep. 2001); U.S. Pat. No. 6,815,744 issued to Beck et al. on Nov. 9, 2004; and, U.S. Pat. No. 6,204,139 issued to Liu et al. on Mar. 20, 2001.

Transition metal oxide materials are one class of materials that can be conditioned such that they exhibit a bi-stable electrical resistance and, therefore, they have a wide range of potential applications. This conditioning process involves subjecting the insulating dielectric material to an appropriate electrical signal for a sufficient period of time in order to generate a confined conductive region in the transition metal oxide that can be reversibly switched between two or more resistance states. However, there is a large variation in the time required for conditioning transition metal oxides. Due to this large time variation, bulk conditioning of multiple memory elements is difficult because once a single memory element is conditioned, current must be limited in order to prevent the conditioned element from burning-out when subjected to additional current as other memory elements continue to undergo conditioning. Consequently, individual conditioning of each memory cell is generally required. This time-consuming process of conditioning each memory cell individually and the large variations in conditioning nominally identical programmable resistors used in the memory cells and in devices formed with such memory cells severely hinders manufacturability and is impractical for production type arrays. Therefore, there is a need in the art for both a semiconductor structure and a method that allow for simultaneous conditioning of multiple parallel memory elements in devices with multiple memory cells.

SUMMARY

In view of the foregoing, embodiments of the invention provide both a semiconductor structure and a method that allow for simultaneous conditioning of multiple parallel memory elements in devices with multiple memory cells.

An embodiment of the invention provides a semiconductor structure that allows for simultaneous conditioning of multiple parallel memory elements in devices with multiple memory cells. The semiconductor structure comprises multiple memory cells each having a memory element. These memory elements comprise a transition metal oxide (i.e., a bi-stable layer with programmable electrical resistance) layered between first electrodes and second electrodes (i.e., each memory element comprises a transition metal oxide layer sandwiched between a first electrode and a second electrode). The semiconductor structure further comprises a temporary series resistor and/or permanent series resistors. These series resistors are configured so that they limit current passing through the memory elements during a simultaneous conditioning process. Thus, damage to the conditioned transition metal oxide in individual memory elements is avoided while other memory elements are still undergoing the conditioning process (i.e., the temporary series resistor and/or permanent series resistors limit the current passing through the memory elements to avoid damaging the transition metal oxide once it is conditioned).

Specifically, the semiconductor structure can comprise a blanket temporary series resistor that is electrically connected to exposed second electrodes of the memory elements. The current is then applied simultaneously to the memory elements via the temporary series resistor. This temporary series resistor can take several different forms. For example, the temporary series resistor can comprise a temporary resistive layer-metal layer stack over the memory elements such that a resistive layer of the stack contacts the second electrodes. Alternatively, the temporary series resistor can comprise an electrolyte solution or a plasma, having selected conductive and resistive properties, that is contained over the memory elements such that the electrolyte solution or plasma contacts the second electrode of each of the memory elements. Similarly, the temporary series resistor can comprise mercury that is contained over the memory elements such that the mercury contacts the second electrode of each of the memory elements. Current applied to the temporary series resistor (e.g., to the resistive layer via the metal layer, the electrolyte solution, the plasma, the mercury, etc.) from a power supply is evenly and simultaneously distributed through the temporary series resistor to the memory elements located immediately below and contacting the temporary series resistor. The size of the temporary series resistor (e.g., an area measurement defining the number of memory elements above which the temporary series resistor is positioned) is predetermined based on the output capacity of the power supply used to apply the current and by the probe contact resistance that can be tolerated in order to ensure that the current is applied equally to each of the memory elements below the resistor. Thus, a given device with multiple cells may be configured with multiple temporary series resistors, each having a predetermined size sufficient to contact the second electrodes of a group of memory elements and to ensure that those memory elements will be simultaneously conditioned.

In addition to or instead of the temporary series resistor, described above, the semiconductor structure of the invention can comprise permanent series resistors that are each electrically connected to corresponding first electrodes of the memory elements. As with the temporary resistor, the permanent resistors function to limit current passing through the memory elements during a simultaneous conditioning process in order to avoid damaging the transition metal oxide in each of the memory elements once conditioned. Typically, each memory cell comprises a diffusion region with a first conductivity type that contacts a corresponding first electrode of a memory element. Such memory cells also comprise a semiconductor substrate with a second conductivity type below the diffusion region. Permanent series resistors can be created by incorporating a semiconductor well into each of the memory cells. Specifically, a semiconductor well with the second conductivity type that connects the semiconductor substrate in series with the diffusion region can function as a series resistor if this semiconductor well has less of a second conductivity type dopant than the semiconductor substrate.

An embodiment of the invention also provides a method of simultaneously conditioning multiple memory elements in devices with multiple memory cells. The method comprises forming multiple memory cells on a semiconductor substrate. Each memory cell is formed by forming a transistor and then forming a memory element on the drain region of the transistor. Memory elements are formed by layering a transition metal oxide (i.e., a bi-stable layer with programmable electrical resistance) between first (lower) electrodes and second (upper) electrodes. The method further comprises forming a temporary series resistor over the memory cells at the wafer surface and/or permanent series resistors within the memory cells. Once the temporary and/or permanent series resistors are formed current can be simultaneously applied to the memory elements so as to condition the transition metal oxide in each of the memory elements. The series resistors are configured so that, during this simultaneous conditioning process, they limit current passing through the memory elements. Thus, damage to conditioned transition metal oxide in individual memory elements is avoided while other memory elements are still undergoing the conditioning process (i.e., the temporary series resistor and/or permanent series resistors limit the current passing through the memory elements to avoid damaging the transition metal oxide once it is conditioned).

Specifically, the method can comprise forming a blanket temporary series resistor over the memory elements such that the temporary series resistor contacts the second electrodes of the memory elements. The temporary series resistor can be formed using various techniques. For example, the temporary series resistor can be formed by forming a temporary resistive layer-metal layer stack over the memory elements such that a resistive layer of the stack contacts the second electrodes. Alternatively, the temporary series resistor can be formed by selecting either an electrolyte solution or plasma that has selected conductive and resistive properties and, then, containing the electrolyte solution or plasma over the memory elements such that it contacts the second electrodes. Similarly, the temporary series resistor can be formed by containing mercury over the memory elements such that the mercury contacts the second electrode of each of the memory elements.

Current can be simultaneously applied to the memory elements by applying current from a power supply to the temporary series resistor (e.g., to the resistive layer via the metal layer, to the electrolyte solution, to the plasma, or to the mercury). Specifically, current applied to the temporary series resistor is distributed evenly and simultaneously through the temporary series resistor to the memory elements located immediately below. A size of the blanket temporary series resistor (e.g., an area measurement defining the number of memory elements above which the temporary series resistor is positioned) can be predetermined based on the output capacity of the power supply that is used to apply the current and by the probe contact resistance that can be tolerated in order to ensure that the current is applied equally to each of the memory elements that are located below the resistor. Thus, for a given device with multiple cells multiple temporary series resistors can be formed, each having a predetermined size sufficient to contact the second electrodes of a group of memory elements and to ensure that those memory elements will be simultaneously conditioned.

In addition to or instead of forming the temporary series resistor, described above, the method of the invention can also comprise forming permanent series resistors that are electrically connected in series to corresponding first electrodes of the memory elements. As with the temporary resistors, these permanent resistors function to limit current passing through the memory elements during a simultaneous conditioning process in order to avoid damaging the transition metal oxide in each of the memory elements once conditioned. Permanent series resistors can be created by incorporating a semiconductor well with a second conductivity type in series between a semiconductor substrate with the same conductivity type and a diffusion region with a first conductivity type. If this semiconductor well is formed so that it has less of a second conductivity type dopant than the semiconductor substrate it will function as a series resistor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1:
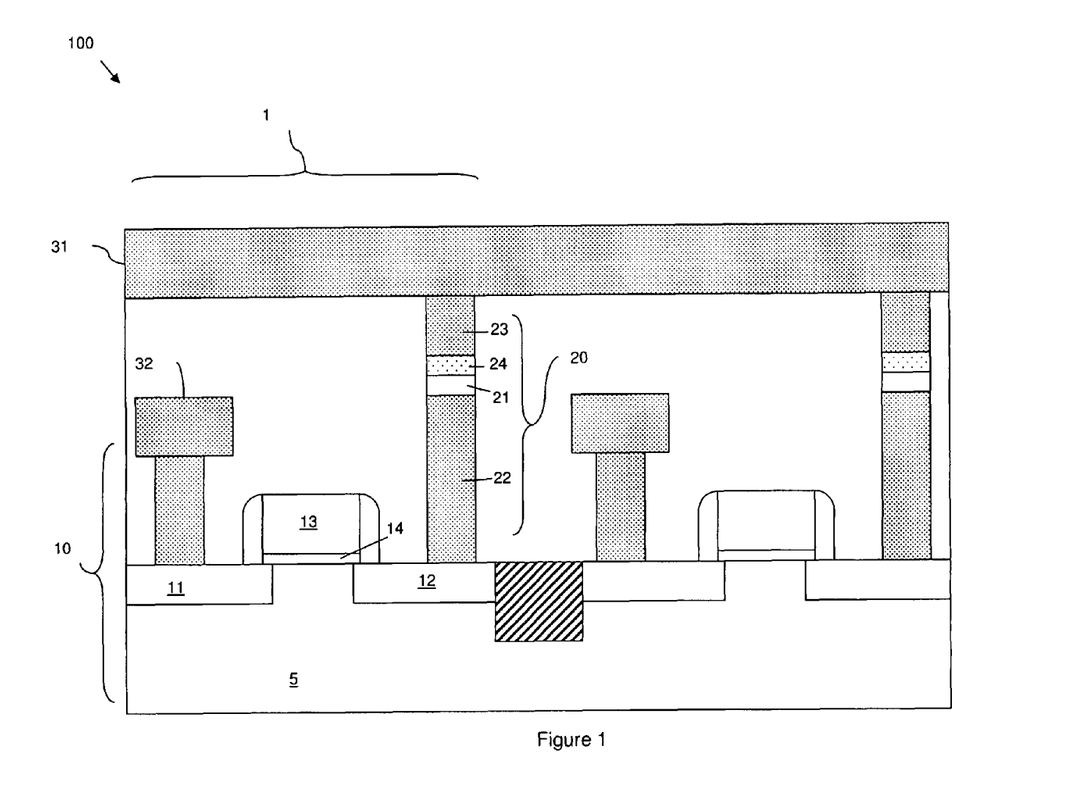
FIG. 1 is a schematic drawing illustrating a cross-section of a portion of a nonvolatile memory device with multiple memory cells.

FIG. 1 is a cross-sectional diagram illustrating a portion of a nonvolatile memory device 100 with multiple memory cells 1. In this configuration, each memory cell 1 comprises a transistor 10. Each transistor 10 comprises a source region 11 and a drain region 12 formed in a semiconductor substrate 5. Each transistor 10 also comprises a gate electrode 13 formed on a gate dielectric film 14 above the substrate 5 between the source/drain regions 11, 12. A memory element 20 contacts the drain region 12 and comprises a variable resistor 21 (and, optionally, a platinum (Pt) layer 24) sandwiched between a first (lower) electrode 22 and a second (upper) electrode 23. The variable resistor 21 comprises a transition metal oxide (e.g., strontium titanium oxide ($SrTiO_3$), strontium barium titanium oxide (($Sr, Ba)TiO_3$), praseodymium calcium manganese oxide (($Pr,Ca)MnO_3$), strontium zirconium oxide ($SrZrO_3$), nickel oxide (NiO), titanium oxide ($TiO_2$), tantalum oxide ($Ta_2O_5$), or other transition metal oxides. The transition metal oxides can be doped preferentially with chromium, manganese, or vanadium.) The transistor 10 and the variable resistor 21 of the memory element 20 are electrically connected to each other in series by contact between the drain region 12 and the first electrode 22. Additionally, the second electrode 23 is connected to metal interconnects 31 that serve as bit lines, the gate electrode 13 is connected to word lines, and the source region 11 is connected to other metal interconnects 32 that serve as common lines.

As discussed above, the desire resistance value of such transition metal oxides 21 in the memory element 20 can be activated upon voltage/current conditioning. More specifically, transition metal oxides are insulating as-deposited and, thus, need to be conditioned in order to exhibit the bi-stable electrical resistance for utility as memory elements. The conditioning process involves subjecting the transition metal oxide in its insulating dielectric state to an appropriate electrical signal for a sufficient period of time in order to generate a confined conducting region that can be reversibly switched between two or more resistance states. For example, resistance properties of transition metal oxides can be switched, as illustrated in U.S. Pat. No. 6,815,744 to Beck and U.S. Pat. No. 6,204,139 to Liu, cited above and incorporated herein by reference, by applying short electrical pulses to the material. However, there is a large variation in the time required for conditioning transition metal oxides. Due to this large time variation, bulk conditioning of multiple memory elements is difficult because once a single memory element is conditioned current through that conditioned element must be limited in order to prevent the conditioned element from burning-out when subjected to additional current as other memory elements continue to undergo conditioning. Consequently, current practice requires individual conditioning of each memory cell is typically required. This time-consuming process of conditioning each memory cell individually and the large variations in identical programmable resistors used in the memory cells and in devices formed with such memory cells severely hinders manufacturability and is impractical for production-type arrays. Therefore, there is a need in the art for both a semiconductor structure and a method that allow for simultaneous conditioning of multiple parallel memory elements in devices with multiple memory cells.

In view of the foregoing, embodiments of the invention provide both a semiconductor structure and a method that allow for simultaneous conditioning of multiple parallel memory elements in devices with multiple memory cells.

Figure 2:
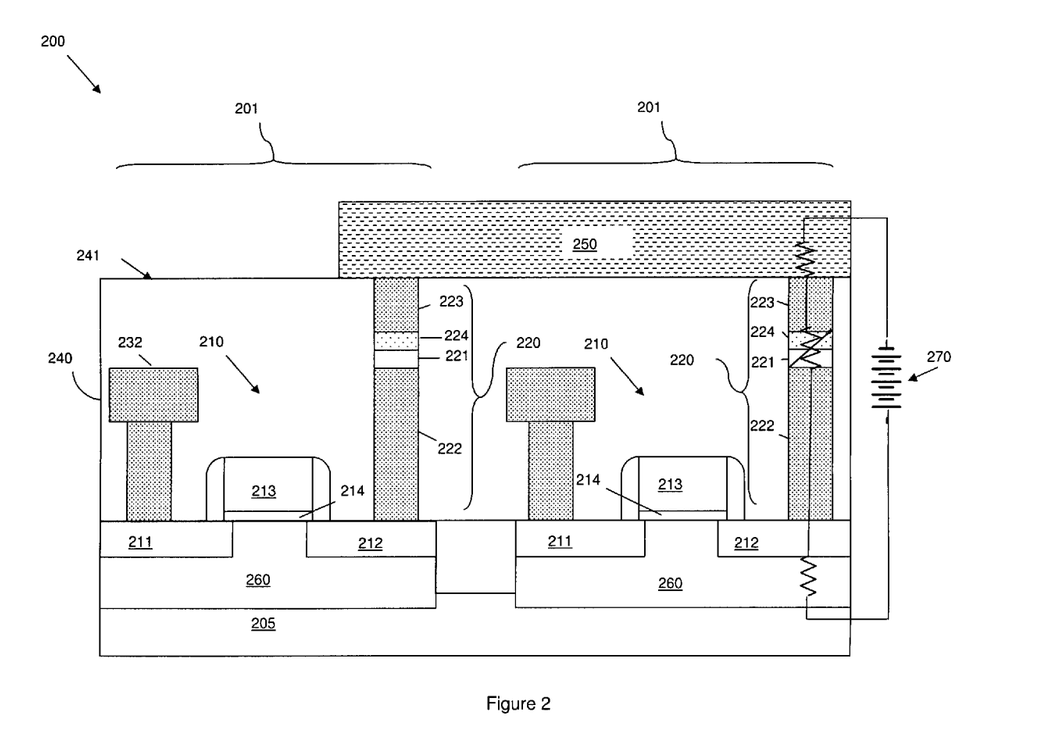
FIG. 2 is a schematic drawing illustrating an embodiment of the structure of the invention.

Referring to FIG. 2, embodiments of the invention provide a semiconductor structure 200 that allows for simultaneous conditioning of multiple parallel memory elements 220 in devices with multiple memory cells 201. In this configuration, each memory cell 201 comprises a transistor 210. Each transistor 210 comprises a source region 211 (e.g., an N+ silicon diffusion region) and a drain region 212 (e.g., an N+ silicon diffusion region) formed in a semiconductor substrate 205 (e.g., a P+ silicon substrate). Each transistor 210 also comprises a gate electrode 213 formed on a gate dielectric film 214 (e.g., an oxide film) that is positioned above the substrate 205 between the source/drain regions 211, 212. A memory element 220 contacts the drain region 212 and comprises a variable resistor 221 (and, optionally, a platinum (Pt) layer 224) sandwiched between a first (lower) electrode 222 and a second (upper) electrode 223. The variable resistor 221 comprises a transition metal oxide (e.g., strontium titanium oxide ($SrTiO_3$), strontium barium titanium oxide (($Sr, Ba)TiO_3$), praseodymium calcium manganese oxide (($Pr,Ca)MnO_3$), strontium zirconium oxide ($SrZrO_3$), nickel oxide (NiO), titanium oxide ($TiO_2$), tantalum oxide ($Ta_2O_5$), or other transition metal oxides. The transition metal oxides can be doped preferentially with chromium, manganese, or vanadium.) The transistor 210 and the variable resistor 221 of the memory element 220 are electrically connected to each other in series by contact between the drain region 212 and the first electrode 222. The source region 211 is connected to metal interconnects 232 that will serve as common lines for the finished memory device. A dielectric material 240 with a planar top surface 241 at which the second electrodes 223 are exposed, isolates the various features.

The semiconductor structure 200 further comprises a temporary blanket series resistor 250 at the surface 241 and/or permanent series resistors 260 within the semiconductor substrate 205 (see detailed description below). These series resistors 250, 260 are configured so that they limit current passing through the memory elements 220 during the process of simultaneously conditioning the transition metal oxide 221 and, thus, so that the transition metal oxide will exhibit the desired bi-stable electrical resistance (i.e., conditioning to exhibit the desired resistive properties). Thus, damage (i.e., burn-out) to conditioned transition metal oxide 221 in individual memory elements 220 is avoided while other memory elements 220 are still undergoing the conditioning process (i.e., the temporary series resistor 250 and/or permanent series resistors 260 limit the current passing through the memory elements to avoid damaging the transition metal oxide 221 once it is conditioned).

Specifically, the semiconductor structure 200 can comprise a series resistor 250 that is temporarily connected in series to exposed second electrodes 223 of the memory elements 220 (i.e., a blanket resistor is formed on top of the exposed second electrodes of the memory elements and, then, following the transition metal oxide conditioning process (discussed below, the blanket resistor is removed). This blanket resistor can take several different forms (see FIGS. 3-6). For example, referring to FIG. 3, the temporary series resistor can comprise a temporary resistive layer 351-metal layer 352 stack 353 over the memory elements 220 such that a resistive layer 351 of the stack 353 contacts the second electrodes 223. Alternatively, the temporary series resistor can comprise an electrolyte solution (see item 451 of FIG. 4) or plasma (see item 551 of FIG. 5), having selected conductive and resistive properties, that is contained (e.g., in a sealed container (see items 452-453 of FIG. 4 and items 552-553 of FIG. 5) over the memory elements 220 such that the electrolyte solution 451 or plasma 551 contacts the second electrode 223 of each of the memory elements 220. Similarly, referring to FIG. 6, the temporary series resistor can comprise mercury 651 (i.e., a liquid metal at room temperature that exhibits poor conductivity) that is contained (e.g., in a sealed container 652-653) over the memory elements such that the mercury 651 contacts the second electrode 223 of each of the memory elements 220.

Referring again to FIG. 2, current applied from a power source 270 to the temporary series resistor 250 (e.g., to the resistive layer 351 via the metal layer 352, which evenly distributes the potential around the resistive layer 351, (see FIG. 3), to the electrolyte solution 451 (see FIG. 4), to the plasma 551 (see FIG. 5), or to the mercury 651 (see FIG. 6)) is evenly and simultaneously distributed through the temporary series resistor 250 to the memory elements 220 located immediately below. Specifically, the current can be applied using suitable known techniques for programming the selected transition metal oxide material, for example, as illustrated in the prior art documents cited above in the "Description of the Related Art" and incorporated herein by reference.

Figure 7:
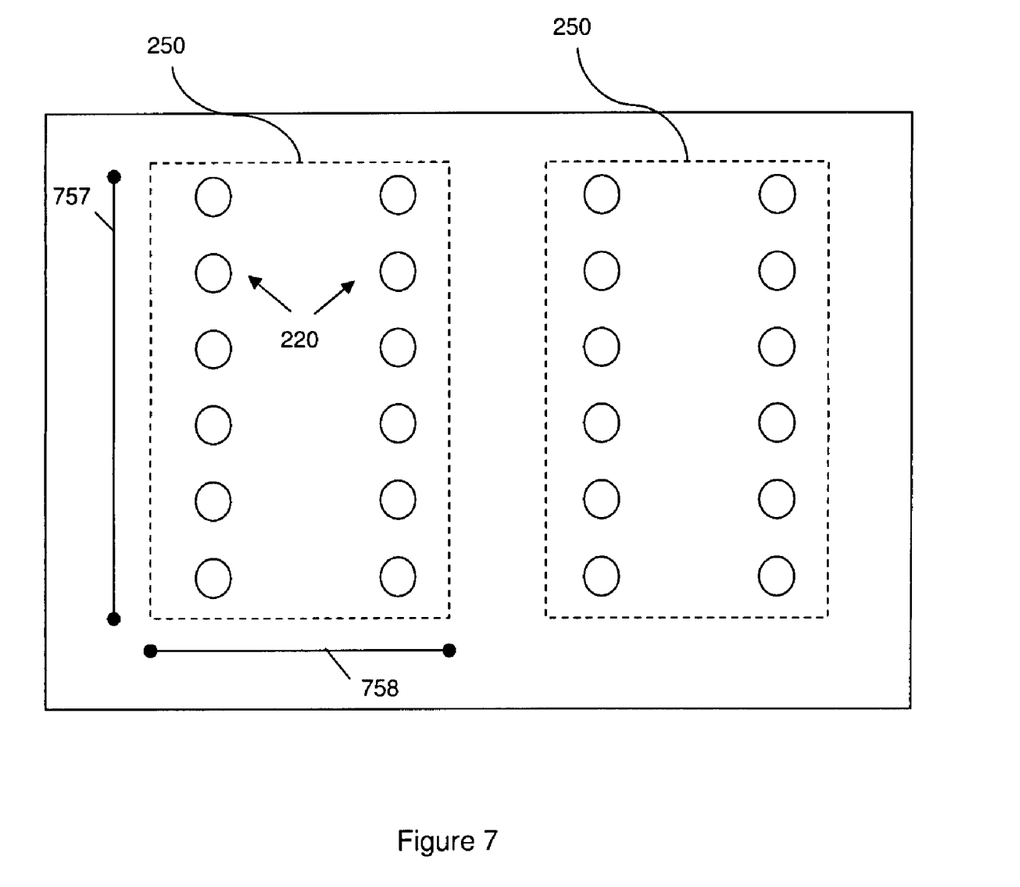
FIG. 7 is a schematic drawing illustrating a top view of the structure of FIG. 2.

Referring to FIG. 7, the size of the temporary series resistor 250 (e.g., an area measurement (i.e., length 757 by width 758) or volume measurement (not shown) that ultimately defines the number of memory elements 220 above which the temporary series resistor 250 is positioned) is predetermined based on the output capacity of the power supply (see item 270 of FIG. 2) used to apply the current and by the probe contact resistance that can be tolerated in order to ensure that the current is applied equally to each of the memory elements 220 below the resistor 250. Thus, a given device with multiple cells may be configured with multiple temporary series resistors 250, each having a predetermined size sufficient to contact the second electrodes of a group of memory elements 220 and to ensure that those memory elements 220 will be simultaneously conditioned.

Figure 8:
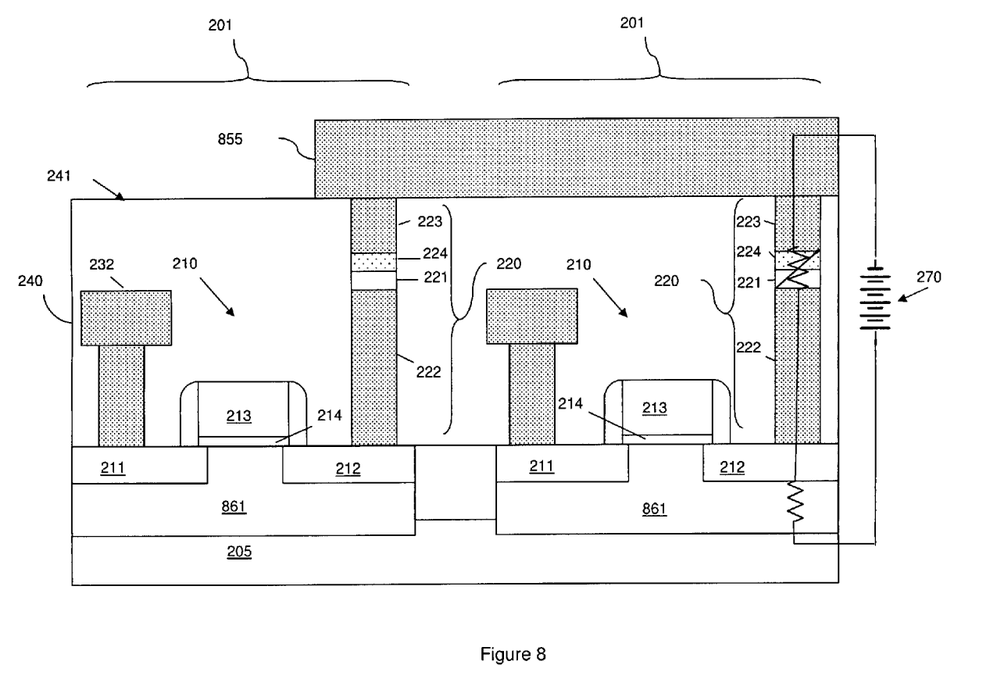
FIG. 8 is a schematic drawing illustrating another embodiment of the structure of the invention.

Referring again to FIG. 2, in addition to or instead of the temporary series resistor 250, described above, the semiconductor structure 200 of the invention can also comprise additional resistors 260 that are each permanently connected in series to corresponding first electrodes 222 of the memory elements 220 (i.e., corresponding resistors 260 are electrically connected in series to the first electrodes during the memory cell formation process and these resistors 260 remain incorporated into the memory cells even after the transition metal oxide conditioning process (discussed below). As with the temporary series resistor, these permanent series resistors 260 function to limit current passing through the memory elements 220 during a simultaneous conditioning process in order to avoid damaging the transition metal oxide 221 in each of the memory elements 220 once conditioned. Typically, as discussed above, each memory cell 201 comprises a drain region 212 with a first conductivity type (e.g., an N+ silicon diffusion region) that contacts a corresponding first electrode 222 of a memory element 220. Such memory cells 201 also comprise (i.e., are formed from) a semiconductor substrate 205 with a second conductivity type (e.g., a P+ silicon substrate) below the diffusion region 212. Referring to FIG. 8, permanent series resistors can be created by incorporating a semiconductor well 861 into each of the memory cells 201. Specifically, a semiconductor well 861 with the second conductivity type (e.g., a p-type well) that connects the semiconductor substrate 205 in series with the diffusion region 212 can function as a series resistor, if this semiconductor well 861 has less of a second conductivity type dopant than the semiconductor substrate 205 (i.e., a P-well 861/P+ substrate 205 combination).

Additionally, if the semiconductor structure of the invention is formed without a temporary series resistor, as illustrated in FIG. 8, the structure can further comprise a conductor 855 (e.g., a temporary metal plate) over the memory elements 220 such the second electrodes 223 the memory elements 220 are contacted. Then, current applied to this conductor 855 from a power source 270 is distributed evenly and simultaneously to the memory elements 220 located immediately below.

Figure 9:
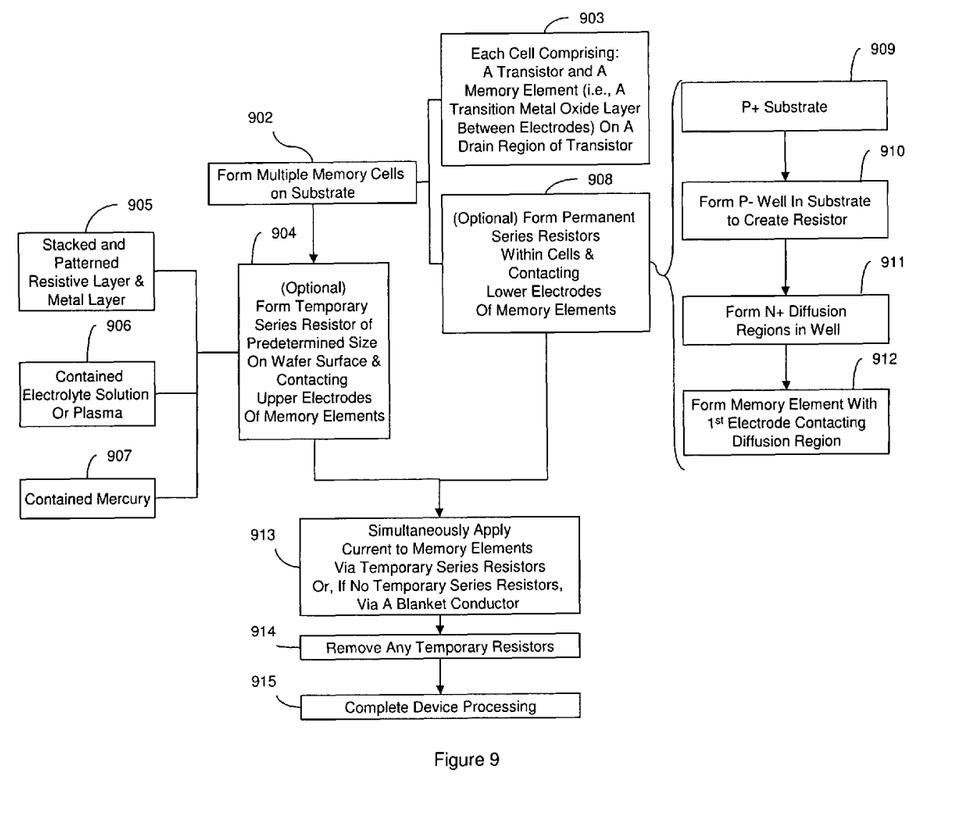
FIG. 9 is a flow diagram illustrating an embodiment of the method of the invention.

Referring to FIG. 9 in combination with FIG. 2, an embodiment of the invention also provides a method of simultaneously conditioning multiple memory elements 220 in devices with multiple memory cells 201. The method comprises first using known techniques to form multiple memory cells 201 for a nonvolatile memory device on a semiconductor substrate 205 (e.g., a P+ silicon substrate) (902). Each memory cell 201 is formed by forming a transistor 210 on the wafer and then, forming a memory element 220 that contacts the drain region 212 of the transistor 210. Specifically, to form multiple memory cells 201, multiple transistors 210 can be formed on the wafer such that each transistor 210 comprises a source region 211 (e.g., an N+ silicon diffusion region), a drain region 212 (e.g., an N+ silicon diffusion region) and a gate (e.g., a gate electrode 213 formed on a gate dielectric film 214 above the substrate 205 between the source/drain regions 211, 212). The memory elements 220 for the memory cells 201 can be formed by forming a first electrode 222 on each drain region 212, by forming a layer of transition metal oxide 221 on the first electrode 222, by optionally forming a layer of platinum 224 on the transition metal oxide 221 and by forming a second electrode 223 on the platinum 224 so that the second electrode is exposed at the top surface 241 of a dielectric 240 (903). The variable resistor 221 can comprises a transition metal oxide (e.g., strontium titanium oxide (SrTiO$_3$), strontium barium titanium oxide ((Sr, Ba)TiO$_3$), praseodymium calcium manganese oxide ((Pr,Ca)MnO$_3$), strontium zirconium oxide (SrZrO$_3$), nickel oxide (NiO), titanium oxide (TiO$_2$), tantalum oxide (Ta$_2$O$_5$), or other transition metal oxides. The transition metal oxides can be doped preferentially with chromium, manganese, or vanadium.)

As the memory cells are being formed permanent series resistors 260 can, optionally, be formed within the memory cells (908). Furthermore, in addition to these permanent series 260 resistors or instead of these permanent series resistors 260, a temporary series resistor 250 can be formed on the memory cells (904).

Once the temporary 250 and/or permanent series resistors 260 are formed one or within the memory cells, respectively, current can be simultaneously applied to the memory elements 220 so as to condition the transition metal oxide 221 in each of the memory elements 220 (913). The series resistors 250, 260 are configured so that, during this simultaneous conditioning process (913), they limit current passing through the memory elements 220. Thus, damage to conditioned transition metal oxide in individual memory elements is avoided while other memory elements are still undergoing the conditioning process (i.e., the temporary series resistor 250 and/or permanent series resistors 260 limit the current passing through the memory elements to avoid damaging transition metal oxide in any of the memory elements once it is conditioned). Following the conditioning process 913, the temporary series resistor 250 will be removed and the memory device will be completed, for example, by conventional processing techniques (914-915).

Specifically, the method can comprise forming a blanket temporary series resistor 250 over the memory elements 220 such that the temporary series resistor 250 contacts the second electrodes 223 of the memory elements 220 (904). The temporary series resistor 250 may be formed using various techniques (905-907; see FIGS. 3-6). For example, the temporary series resistor can be formed by forming a temporary resistive layer 351-metal layer 352 stack 353 over the memory elements 220 such that a resistive layer 351 of the stack 353 contacts the second electrodes 223 (905; see FIG. 3). Alternatively, the temporary series resistor can be formed by selecting either an electrolyte solution (906; see item 451 of FIG. 4) or a plasma (906; see item 551 of FIG. 5) that has selected conductive and resistive properties and, then, containing the electrolyte solution 451 or plasma 551 over the memory elements 220 such that it contacts the second electrodes 223. Similarly, the temporary series resistor can be formed by containing mercury 651 over the memory elements 221 such that the mercury 651 contacts the second electrodes 223 (907; see FIG. 6). The size of the blanket temporary series resistor 250 (e.g., an area measurement that defines the number of memory elements above which the temporary series resistor is positioned) can be predetermined, prior to formation, based on the output capacity of the power supply 270 that is used to apply the current and by the probe contact resistance that can be tolerated in order to ensure that the current is applied equally to each of the memory elements 220 that are located below the resistor 250. Thus, for a given device with multiple cells 201, multiple temporary series resistors 250 can be formed at process 904 and used at process 913 (see FIG. 7). The multiple temporary series resistor 250 can each have a predetermined size sufficient to contact the second electrodes 223 of a group of memory elements so as to ensure that those memory elements will be simultaneously conditioned.

Figure 3:
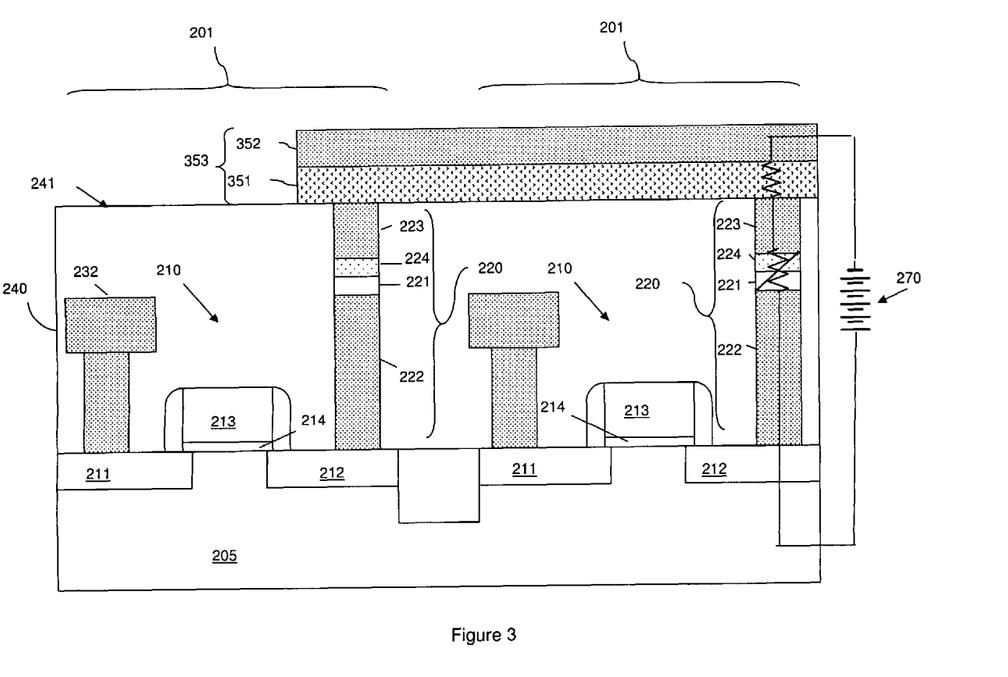
FIG. 3 is a schematic drawing illustrating another embodiment of the structure of the invention.
Figure 4:
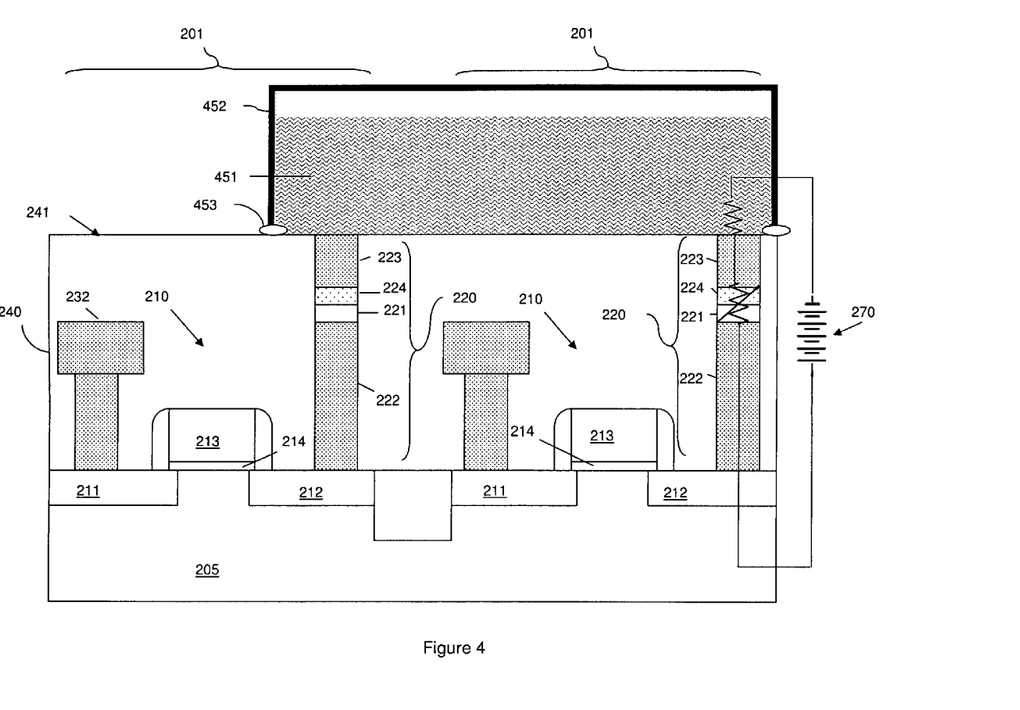
FIG. 4 is a schematic drawing illustrating another embodiment of the structure of the invention.
Figure 5:
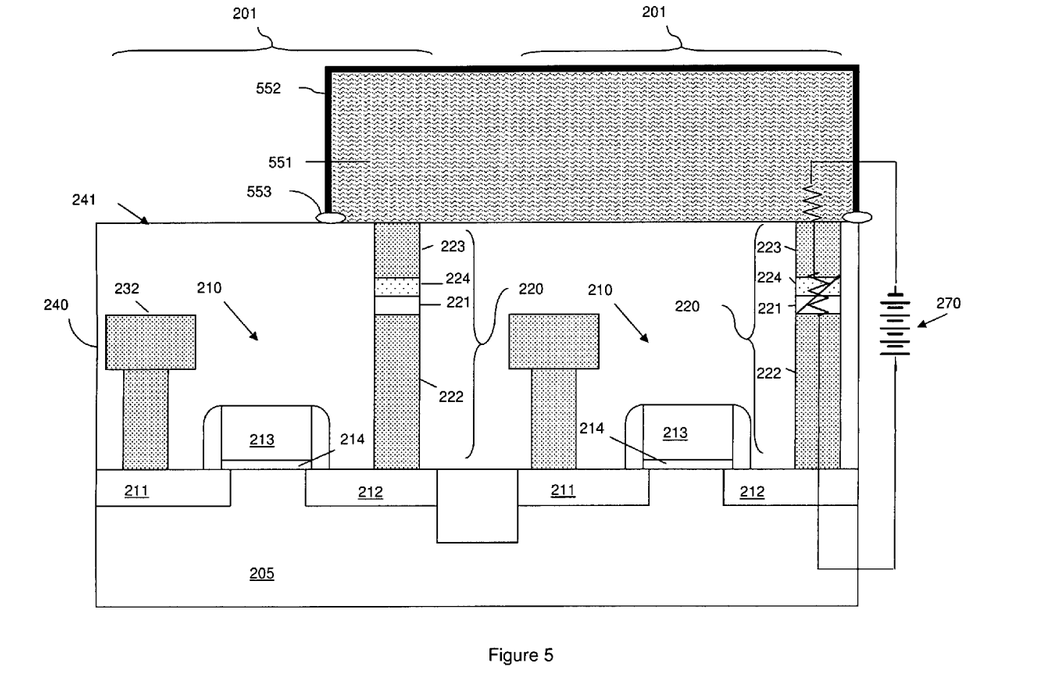
FIG. 5 is a schematic drawing illustrating another embodiment of the structure of the invention.
Figure 6:
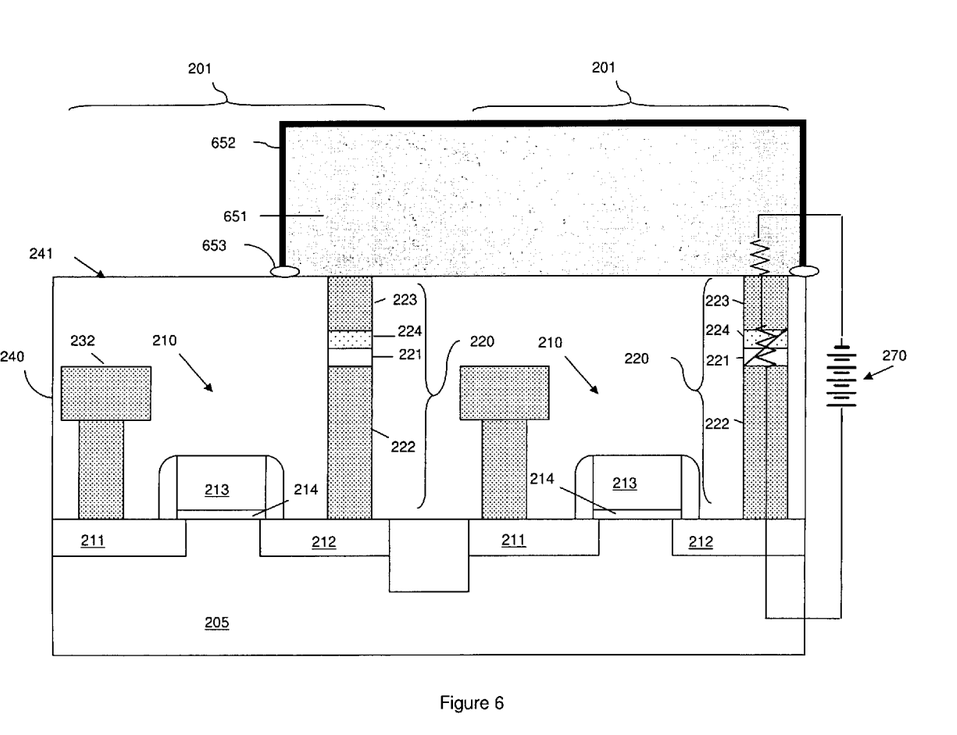
FIG. 6 is a schematic drawing illustrating another embodiment of the structure of the invention.

After formation of the temporary series resistor (at process 904), current can be simultaneously applied from a power supply 270 to the memory elements 220 (at process 913) by applying current to the temporary series resistor 250 (e.g., to the resistive layer 351 of FIG. 3 via the metal layer 35, which evenly distributes the potential around the entire resistive layer, to the electrolyte solution 451 of FIG. 4, to the plasma 551 of FIG. 5, or to the mercury 651 of FIG. 6). Specifically, the current can be applied using suitable known techniques for programming the selected transition metal oxide, for example, as illustrated in the prior art documents cited above and incorporated herein by reference. The current as applied to the temporary series resistor 250 is evenly and simultaneously distributed through the temporary series resistor to the memory elements 220 located immediately below and contacting the temporary series resistor 250.

Those skilled in the art will recognize that by supplying the current to the exposed contacts 223 via the electrolyte solution, plasma or mercury, vice a deposited resistive layer-metal layer stack, memory device manufacturing costs are reduced because less processing is required to remove these types of temporary series resistors from the wafer surface following completion of conditioning (at process 913).

In addition to or instead of forming the temporary series resistor 250 on the wafer surface (at process 904), as described above, the method of the invention can also comprise forming permanent series resistors 260 within the wafer substrate (908). Specifically, these series resistors 260 are formed during memory cell formation so that they are electrically connected in series to corresponding first electrodes 222 of the memory elements 220. As with the temporary series resistors, these permanent series resistors function to limit current passing through the memory elements 220 during a simultaneous conditioning process in order to avoid damaging the transition metal oxide 221 in each of the memory elements 220 once they are conditioned. As mentioned above, each memory cell 201 is formed to have a memory element 220 on a drain region 212 above a substrate 205 (902-903). The permanent series resistors 260 can be created by incorporating a semiconductor well 861 into each of the memory cells 201 between this drain region 212 and the substrate 205 (909-912). Specifically, in order to form each memory cell 201 with a series resistor 260, the substrate 205 with a second conductivity type is provided (e.g., a P+ silicon substrate) (909). A semiconductor well 861 with the second conductivity type, but having less of a second conductivity type dopant than the substrate (e.g., a P- silicon well), is then formed in the substrate 205 (910). The diffusion regions 211 and 212, having a first conductivity type (e.g., N+ silicon diffusion regions), are formed in the well 861 (911, see FIG. 8). Thus, the semiconductor well 861 connects the semiconductor substrate 205 with the drain region 212. By forming the semiconductor well 861 with less of a second conductivity type dopant than the semiconductor substrate 205 (during process 910), this well 861 will function as a series resistor.

In the event that a temporary series resistor is not formed (at process 904), the method can further comprise forming a conductor (e.g., see temporary metal plate 855 of FIG. 8) over the memory elements 220 such the second electrode 223 of each of the memory elements 220 are contacted. Then, during process 913, current applied to this conductor 855 from a power source 270 can be evenly and simultaneously distributed via the conductor 855 to the memory elements 220 located immediately below.

As mentioned above, following the simultaneous conditioning of the transition metal oxide in the multiple memory elements (at process 913) by use of the structure and method, disclosed herein, any temporary series resistors or temporary metal plates are removed from the wafer surface (914) and additional processing will be performed to complete the non-volatile memory device (e.g., metal interconnects will be formed on the top surface of the dielectric material to serve as bit lines connecting the memory cells to the support circuitry) (915).

Therefore, disclosed above are a semiconductor structure and a method that allow for simultaneous voltage/current conditioning of multiple memory elements in a nonvolatile memory device with multiple memory cells. The structure and method incorporate the use of a resistor connected in series with individual memory elements to limit current passing through the memory elements. Specifically, the method and structure incorporate a blanket temporary series resistor on the wafer surface above the memory cells and/or permanent series resistors within the memory cells. During the conditioning process, these resistors protect transition metal oxide in the individual memory elements from damage (i.e., burn-out), once it has been conditioned.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A semiconductor structure that allows for simultaneous conditioning of multiple parallel memory elements in devices with multiple memory cells, said semiconductor structure comprising:
   multiple parallel memory elements, wherein said memory elements comprise a transition metal oxide layered between first electrodes and second electrodes; and,
   a series resistor temporarily connected in series to said second electrodes, wherein said series resistor is configured to limit current passing through said memory elements during a simultaneous conditioning process of said transition metal oxide in each of said memory elements.

2. The semiconductor structure of claim 1, wherein a size of said temporary series resistor is predetermined based on the output capacity of the power supply used to apply said current in order to ensure that said current is applied equally to each of said memory elements.

3. The semiconductor structure of claim 1, wherein said temporary series resistor comprises a temporary resistive layer-metal layer stack adjacent to said memory elements such that a resistive layer of said stack contacts said second electrodes.

4. The semiconductor structure of claim 1, wherein said temporary series resistor comprises an electrolyte solution that is contained over said memory elements such that said electrolyte solution contacts said second electrode of each of said memory elements, wherein said electrolyte solution has selected conductive and resistive properties.

5. The semiconductor structure of claim 1, wherein said temporary series resistor comprises mercury that is contained over said memory elements such that said mercury contacts said second electrode of each of said memory elements.

6. The semiconductor structure of claim 1, wherein said temporary series resistor comprises a plasma that is contained over said memory elements such that said plasma contacts said second electrode of each of said memory elements, wherein said plasma has selected conductive and resistive properties.

7. The semiconductor structure of claim 1, further comprising additional series resistors electrically connected to said first electrodes of said memory elements to further limit said current passing through said memory elements.

8. A semiconductor structure that allows for simultaneous conditioning of multiple parallel memory elements in devices with multiple memory cells, said semiconductor structure comprising:
   multiple parallel memory elements, wherein said memory elements comprise a transition metal oxide layered between first electrodes and second electrodes;
   series resistors electrically connected in series to corresponding first electrodes of said memory elements, wherein said series resistors are configured to limit current passing through said memory elements during a simultaneous conditioning process of said transition metal oxide in each of said memory elements; and
   a temporary series resistor electrically connected to said second electrodes to further limit said current passing through said memory elements.

9. The semiconductor structure of claim 8, wherein each of said memory cells comprises a diffusion region with a first conductivity type that contacts a corresponding first electrode and a semiconductor substrate with a second conductivity type below said diffusion region,
   wherein each of said series resistors comprises a semiconductor well with said second conductivity type that connects said semiconductor substrate and said diffusion region, and
   wherein said semiconductor well has less of a second conductivity type dopant than said semiconductor substrate and, thereby, functions as a resistor.

10. The semiconductor structure of claim 8, wherein a size of said temporary series resistor is predetermined based on the output capacity of the power supply used to apply said current in order to ensure that said current is applied equally to each of said memory elements.

11. A method of simultaneously conditioning multiple memory elements in devices with multiple memory cells, wherein said memory elements comprise a transition metal oxide layered between first electrodes and second electrodes, said method comprising:
   forming a series resistor over said memory elements such that said series resistor contacts said second electrodes of said memory elements;
   simultaneously applying current to said memory elements so as to simultaneously condition said transition metal oxide in each of said memory elements, wherein said series resistor limits said current passing through said memory elements to avoid damaging said transition metal oxide; and
   removing said series resistor.

12. The method of claim 11, wherein a size of said series resistor is predetermined based on the output capacity of the power supply used for said applying of said current in order to ensure that said current is applied equally to each of said memory elements.

13. The method of claim 11, wherein said forming of said series resistor comprises forming a resistive layer-metal layer stack over said memory elements such that a resistive layer of said stack contacts said second electrodes, and wherein said applying of said current comprises supplying said current to said temporary metal layer.

14. The method of claim 11, wherein said forming of said series resistor comprises forming an electrolyte solution, having selected conductive and resistive properties, and containing said electrolyte solution over said memory elements such that said electrolyte solution contacts said second electrodes, and wherein said applying of said current comprises supplying said current to said electrolyte solution.

15. The method of claim 11, wherein said forming of said series resistor comprises containing mercury over said memory elements such that said mercury contacts said second electrode of each of said memory elements, and wherein said applying of said current comprises supplying said current to said mercury.

16. The method of claim 11, wherein said forming of said series resistor comprises forming a plasma, having selected conductive and resistive properties, and containing said plasma over said memory elements such that said plasma contacts said second electrodes, and wherein said applying of said current comprises supplying said current to said plasma.

17. The method of claim 11, further comprising forming additional series resistors within said memory cells such that said additional series resistors contact said first electrodes of said memory elements to further limit said current passing through said memory elements.

* * * * *